United States Patent [19]

Brust

[11] Patent Number: 4,803,357

[45] Date of Patent: Feb. 7, 1989

[54] METHOD AND ARRANGEMENT FOR DETECTING SECONDARY PARTICLES TRIGGERED ON A SPECIMEN BY A PRIMARY PARTICLE BEAM

[75] Inventor: Hans-Detlef Brust, Dudweiler, Fed. Rep. of Germany

[73] Assignee: Siemens Aktiengesellschaft, Berlin and Munich, Fed. Rep. of Germany

[21] Appl. No.: 6,993

[22] Filed: Jan. 27, 1987

[30] Foreign Application Priority Data

Jan. 27, 1986 [DE] Fed. Rep. of Germany ....... 3602366

[51] Int. Cl.[4] .......................... G01N 23/00; H01J 3/14
[52] U.S. Cl. .................................. 250/310; 250/307; 250/197
[58] Field of Search .............. 250/307, 309, 310, 397; 324/158 R

[56] References Cited

U.S. PATENT DOCUMENTS

| 4,011,450 | 3/1977 | Tagawa et al. ...................... 250/310 |
| 4,068,123 | 1/1978 | Kokubo ............................... 250/310 |
| 4,464,571 | 8/1984 | Plies .................................... 250/305 |

FOREIGN PATENT DOCUMENTS

| 0018031 | 5/1982 | European Pat. Off. . |
| 2011193 | 8/1973 | Fed. Rep. of Germany ...... 250/310 |
| 0149569 | 11/1979 | Japan .................................. 250/310 |
| WO84/00443 | 2/1984 | PCT Int'l Appl. . |
| 1286454 | 8/1972 | United Kingdom ................ 250/310 |

OTHER PUBLICATIONS vol. 6, No. 233, Nov. 19, 1982, for Japanese Patent No. 57-13357 (Patent Abstracts of Japan).
vol. 7, No. 170, Jul. 27, 1983, for Japanese Patent No. 58-78355 (Patent Abstracts of Japan).
vol. 9, No. 140, Jun. 14, 1985, for Japanese Patent No. 60-23944 (Patent Abstracts of Japan).
H. P. Feuerbaum, "VLSI Testing Using the Electron Probe", Scanning Electron Microscopy, vol. 1 (1979).

Primary Examiner—Bruce C. Anderson
Attorney, Agent, or Firm—Hill, Van Santen, Steadman & Simpson

[57] ABSTRACT

A method and arrangement for imaging surface structures and distributions of voltages of a specimen using a scanning microscope that includes a detector system for detecting secondary electrons triggered at the specimen to be investigated. The detector system used includes a plurality of individual detectors arranged symmetrically relative to the specimen so that the secondary particles can be extracted largely symmetrically and independent of the emission point and emission angle. To detect secondary particles emitted in the direction of the symmetry axis of the detector system, an extraction field is generated with time dependent signals so that the secondary particles are accelerated in a momentarily highly asymmetrical field which is symmetrical on a chronological average, the secondary particles being deflected in a direction of regions sensitive to the secondary particles.

18 Claims, 5 Drawing Sheets

METHOD AND ARRANGEMENT FOR DETECTING SECONDARY PARTICLES TRIGGERED ON A SPECIMEN BY A PRIMARY PARTICLE BEAM

BACKGROUND OF THE INVENTION

1. Field of the Invention

The present invention is related generally to a method for detecting secondary particles triggered by a primary particle beam using a detector system with at least one region sensitive to the secondary particles and an extraction and/or deflection field, as well as to an arrangement to implement such method.

2. Description of the Related Art

When a primary particle beam impinges a substrate, then secondary particles are emitted due to the interaction of the primary particles with the substrate. The energy distribution and angular distribution of the secondary particles depends on, among other things, the chemical and physical composition present at the region of interaction, the surface structure, and the voltage distribution present at the specimen. The secondary particles that are triggered in near-surface regions are of particular importance for imaging the surface structures and the distribution of electrical potential using a scanning electron microscope. The secondary electrons are usually detected with a detector arranged laterally of the specimen to be investigated. As a consequence of the asymmetrical arrangement of the detector within a specimen chamber, the detection probability of the secondary electrons is greatly dependent on their emission angle. The detector of the known device is usually formed of an extraction grid, a scintillator, and a photomultiplier coupled by a light guide.

A detector system having a plurality of secondary electron detectors arranged symmetrically relative to a specimen is disclosed in European Pat. No. 0 018 031. The multi-detector system is predominantly used for investigating large specimens to guarantee a largely symmetrical extraction of the secondary electrons independent of the emission point and emission angles. Symmetrical detector arrangements, however, have an important disadvantage in that the secondary electrons emitted nearly in the direction of the symmetry axis of the system are only slightly deflected due to the negligible strength of the extraction field in this region. Thus, such secondary electrons are not documented. As a consequence of the cosine distribution of the exit angle of the secondary particles, however, the probability that secondary electrons will be emitted in the direction of the symmetry axis of the detector arrangement is very high.

SUMMARY OF THE INVENTION

An object of the present invention is to provide a method and arrangement for varying the direction in which secondary particles emitted from a specimen are extracted without modifying the spatial configuration of the detector system. In particular, a largely angle-independent and/or symmetrical extraction of secondary particles is possible, wherein particles emitted in the direction of the axis of symmetry of the detector system are also deflected and detected.

This and other objects are achieved in a method wherein the field generators are driven by time dependent signals so that a chronological change of the field results, the direction of extraction of the secondary particle being alternately deflected in various directions for registration in a detector system, and further that the directional change of extraction is periodically repeated. The time interval over which changes in the extraction direction are undertaken is at most equal to the dwell time of the primary beam on a particular point of the specimen. In preferred embodiments of the present method, the voltages applied to the electrode arrangements are of identical frequenty and are phase-shifted relative to one another to form a rotating field so that the secondary particles are successively deflected in the direction of individual sensitive regions.

An arrangement for practicing the present method includes a signal generator having an output connected to a device for selectively driving individual ones of an electrode arrangement to generate a chronologically changing electrical extraction and/or deflection field, wherein the electrode arrangements are allocated to secondary particle sensitive regions of a detector system for deflecting and accelerating secondary particles. The electrode arrangement is preferably arranged symmetrically relative to the beam axis of the primary beam; and the voltages applied to the electrode arrangement are identical in time and amplitude so that a chronologically average symmetrical extraction of secondary particles ensues. Alternately, the voltages applied to individual electrodes of the electrode arrangement have such a time or amplitude dimension that one direction is preferred, or weighted, in a chronologically averaged extraction of secondary particles. Although other signals are possible, one embodiment has a sinusoidal curve applied to the electrode arangements, while another has an applied square wave curve.

Preferred developments of the arrangement according to the present invention include either an electronic switch for selectively driving the electrode arrangements, or a phase shifter. In one development, the arrangement includes a detector formed by a plurality of individual detectors arranged three-dimensionally; while in another development, the detector arrangement includes an annular light guide having a scintillator layer on an inside surface with a plurality of extraction electrodes disposed symmetrically relative to the light guide.

For purposes of the present specification, the term extraction field may refer to and/or include a deflection field.

DESCRIPTION OF THE PREFERRED EMBODIMENTS

A method of the present invention is set forth below with reference to an example of a detector system for detecting secondary electrons emitted from a specimen by a primary electron beam. Instead of electrons, of course, other particles, such as ions, can also come into consideration as the primary and secondary particles. The detector system is then adapted to detect the specified secondary particles.

Figure 1:
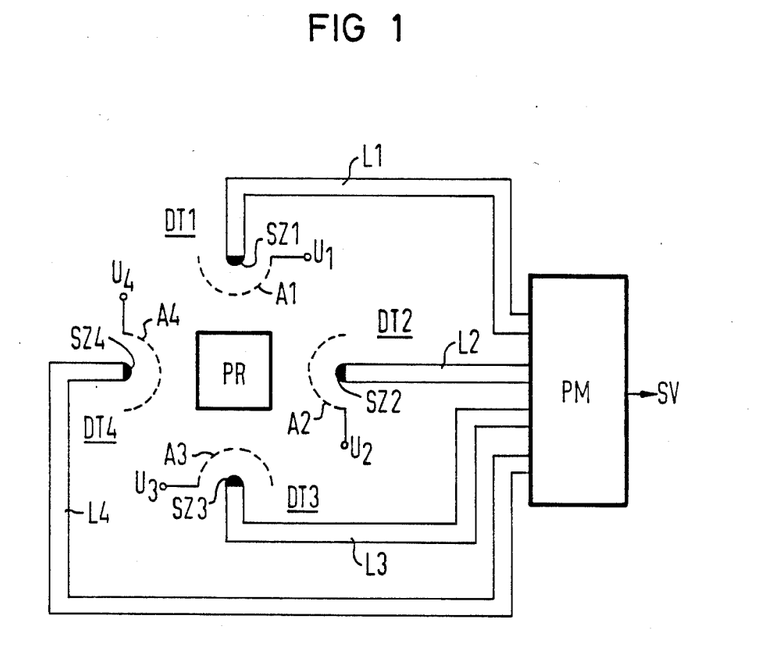
FIG. 1 is a schematic diagram of a detector system for detecting secondary electrons triggered at a specimen by a primary beam according to the present invention.

A detector system is shown schematically in FIG. 1 formed of four individual detectors DT1, DT2, DT3, and DT4. The detector DT1-DT4 are arranged symmetrically relative to a specimen PR. Each of the individual detectors DT1-DT4 is formed of an extraction grid A1, A2, A3, and A4 and of a respective scintillator SZ1, SZ2, SZ3, and SZ4 which are coupled to a common photomultiplier PM by respective light guides L1, L2, L3, and L4. Light pulses generated in the scintillators SZ1-SZ4 by impinging secondary electrons are forwarded in the light guides L1-L4 for conversion into a secondary electrical signal in the photomultiplier PM. The secondary electrical signal is applied to an arrangement for signal processing SV. To the extraction networks A1-A4 for deflecting low energy secondary electrons in the direction of the scintillators SZ1-SZ4 respective voltages U1, U2, U3, and U4 of between −400 and +400 volts can be applied independently of one another. The scintillators SZ1-SZ4 generally lie at a high, positive potential (such as $U_{SZ} \approx 10$ kV) to achieve an adequately high light yield by post-acceleration of the secondary electrons.

Figure 2A:
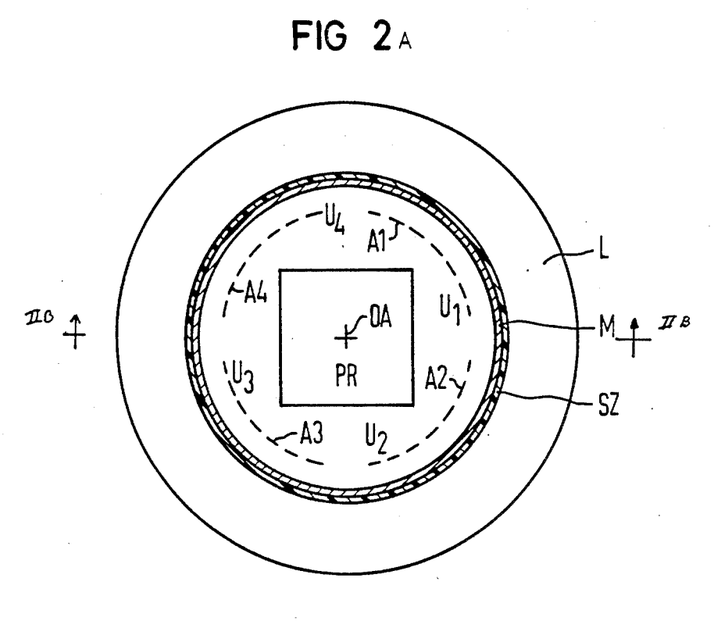
FIG. 2A is a plan view of an alternate embodiment of a detector system of the present invention for secondary particles.
Figure 2B:
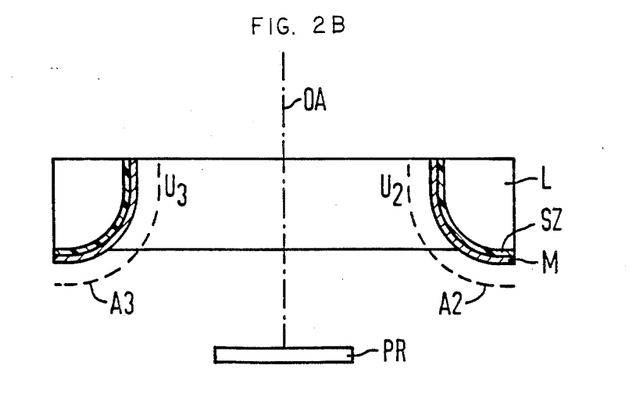
FIG. 2B is a cross section of the detector of FIG. 2A along line IIB—IIB.

A second embodiment of a symmetrical detector system for detecting secondary electrons is shown in FIGS. 2A and 2B. The second embodiment is formed of an annular light guide L arraged concentrically to a symmetry axis OA and having an iside surface coated with a scintillator layer SZ. A thin metal layer M is vapor deposited on the scintillator SZ for providing post-acceleration of the secondary electrons deflected in the direction of the scintillator layer SZ by extraction networks A1, A2, A3, and A4. The extraction networks A1–A4 are arranged concentrically, and preferably symmetrically, relative to the symmetry axis OA of the light guide L. While the metal layer M lies at a high, positive potential of approximately 10 kV, voltages U1, U2, U3, and U4 of between −400 and +400 volts are applied to the respective extraction electrodes A1–A4.

A preferred extraction direction of the secondary electrons can be established in one of the detector systems shown in FIGS. 1 and 2 in a simple way by applying the desired extraction voltage U1–U4 to only one of the extraction electrodes A1–A4. Secondary electrons triggered on the specimen PR by the primary electron beam are then deflected and accelerated only in the direction of the allocated scintillator SZ1–SZ4 by the field of the appertaining electrode A1–A4. A modification of the extraction direction can be provided by switching the extraction voltages to one of the other electrodes A1–A4, for example.

It is possible to achieve an asymmetrical extraction of the secondary electrons from the specimen PR by alternately applying voltages to two neighboring ones of the extractional electrodes A1–A4. Periodic switching of the voltages is undertaken within a time span that should be far shorter than the dwel time of the primary electron beam on the respective measuring point of the specimen surface PR. Due to the voltage change, of course, the direction in which the secondary electrons are deflected also changes periodically at the switching frequency. The change in direction occurs so quickly, however, that a defined extraction direction can be set and varied over a chronological average by adapting the amplitude of the voltages applied to neighboring ones of the electrodes and/or the times during over which these voltages are applied to the respective electrodes.

It is of course possible to successively select individual extraction electrodes A1–A4 with a voltage U1–U4 in such a way that a chronologically variable electrical field is established above the specimen PR. The electrical field thus generated turns in the direction in which the secondary electron are extracted with a constant rotational frequency in a plane perpendicular to the primary beam direction. To again set and vary a preferred extraction direction on a chronological average by variation of the amplitude of the voltages U1–U4 and/or the time span within which the voltages U1–U4 are applied to the respective electrodes A1–A4, the switching of the voltages must ensue within times that are short in comparison to the dwell time of the primary electron beam on a respective point of the specimen surface.

Figure 3:
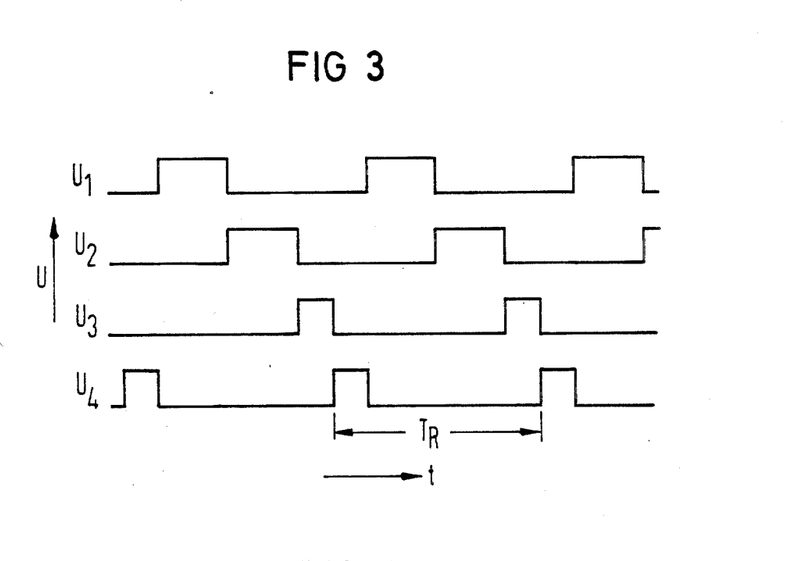
FIG. 3 is a series of time-voltage diagrams of signals for application to extraction electrodes of the detector systems of FIGS. 1 or 2.

To generate an electrical field that turns the extraction direction of the secondary electrons with a constant rotational speed, for example, the voltage curves U1–U4 shown in FIG. 3 are applied to corresponding ones of the extraction electrodes A1–A4 of the detector systems of either FIGS. 1 or 2. The time dependent respective voltages U1–U4 are applied to the extraction electrodes A1–A4, all voltages U1–U4 being assumed to be of identical amplitude. The voltage curves at the extraction electrodes A1–A4 provides a chronologically variable electrical field that turns the direction in which the secondary electrons are extracted from the specimen PR. The rotational frequency is $f_R = T_R^{-1}$, having a period of $T_R$. As a result of the selected voltage curves, however, the rotation of the field is discontinuous. Moreover, the time interval within which a change of extraction direction ensures is not constant during a revolution as a consequence of the duration of the application of the voltages U3 or, respectively, U4 to the electrodes A3 and A4. More secondary electrons are registered in the detectors DT1 and DT2 over a chronological average and, therefore, the extraction is weighted in favor of the detectors DT1 and DT2. Such weighting, or preference, can also be accomplished by applying different amplitudes to the different electrodes.

Figure 4:
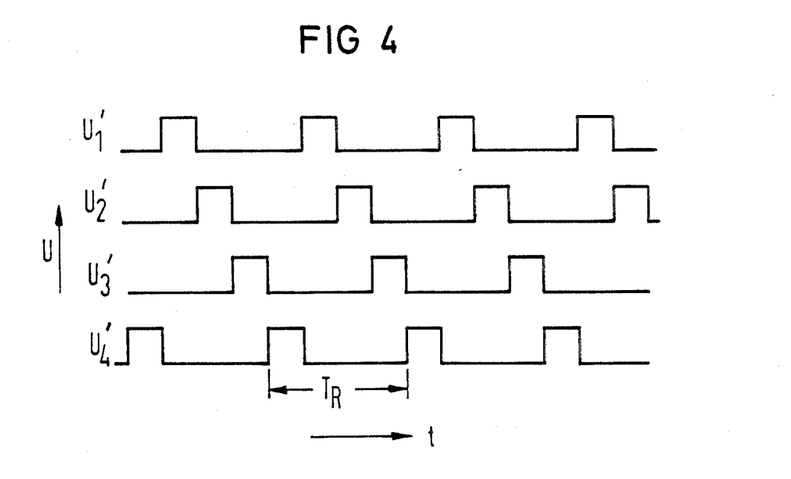
FIG. 4 is a second series of time-voltage diagrams of voltages for application to extraction electrodes of the detector systems of FIGS. 1 or 2.

In FIG. 4, voltages U1', U2', U3' and U4' which generate an electrical field that rotates the extraction direction when applied to the corresponding extraction electrodes A1–A4 are shown. In this exemplary embodiment, the time intervals over which changes in the extraction direction occur are constant during a revolution since the same voltage curve is applied to each of the extraction electrodes A1–A4, albeit phase-shifted. In addition, the voltages U1'–U4' have a rotational frequency $f_R = T_R^{-1}$.

When the rotational period duration $T_R$ is short in comparison to the dwell time of the primary electron beam at a respective measuring point on the specimen surface, then the chronologically averaged extraction of secondary electrons is symmetrical and is largely angle-independent. This symmetry is only present over a chronological average. The instantaneous extraction of secondary electrons ensues in a highly asymmetrical field so that secondary electrons emitted in the direction of the center axis of the detector system are also deflected and documente.

An arrangement for implementing the above-described method is formed of a voltage source, an electronic switch, and a frequency generator driving the switch. The output signal of the frequency generator affects switching of a constant voltage to the individual extraction electrodes A1–A4 of a detector system of either FIGS. 1 or 2.

Figure 6:
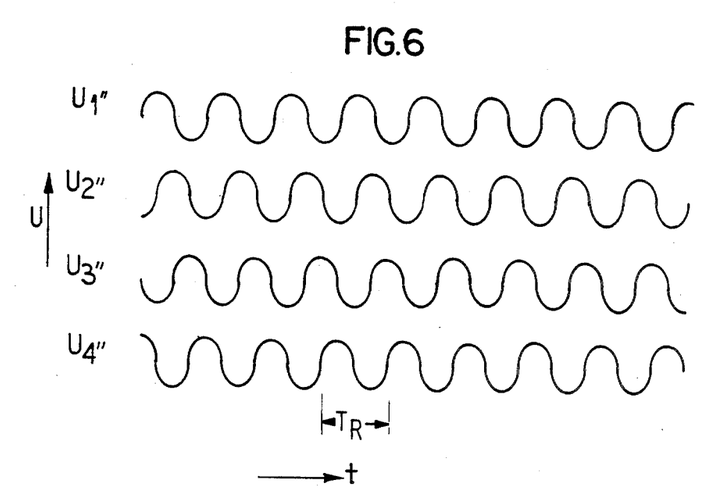
FIG. 6 is a series of time-voltage diagrams of signals of another embodiment for application to the extraction electrodes of the present detector systems.

Differing from the above embodiment, four sinusoidal voltages U1"–U4" that are phase-shifted by 90° with respect to one another are shown in FIG. 6 for application to the extraction electrodes A1–A4. Thus, a chronologically variable field is established over the specimen PR, the field continuously turning the extraction direction of the secondary electrons with a frequency established by the sinusoidal voltages U1"–U4". For an adequately high rotational frequency, an extraction of secondary electrons from the specimen PR that is symmetrical on a chronological average and largely angularly independent is also achieved with this method.

Figure 5:
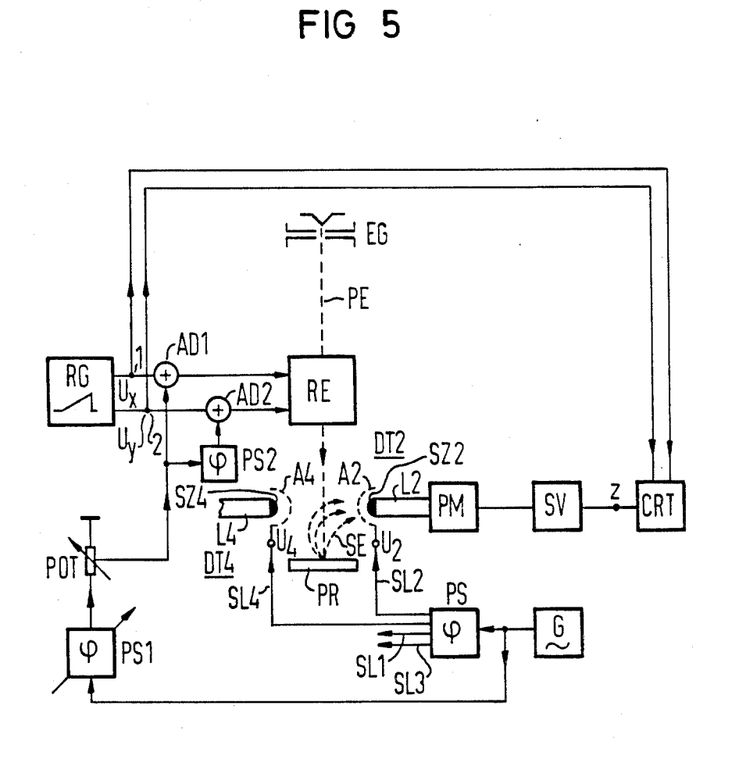
FIG. 5 is a schematic diagram of a measuring system of the invention for imaging a specimen.

An arrangment for implementing the second embodiment of the method is set forth with reference to a measuring system, shown in FIG. 5, for imaging the surface topography of a specimen. The measuring system is essentially formed of a scanning electron microscope, a detector system as shown in FIGS. 1 or 2, and an arrangement for signal processing SV. Signal processing arrangement SV, such as is used here, are known from the prior art. The signal processing arrangement SV is followed by a display which is, for example, a cathode ray tube CRT. To image the specimen PR, a finely focused primary electron beam PE is generated in an electro-optical column of the scanning microscope. In addition to a plurality of diaphragms and magnetic lens systems (not shown) for shaping and focusing the primary electron beam PE, the electro-optical column includes an electron gun EG formed essentially of a cathode, an anode, and a Wehnelt electrode. A deflection unit RE and a scan generator RG allocated to the deflection unit RE are included.

In one exemplary embodiment, the detector system DT shown in FIG. 1 is provided for detecting the secondary electrons SE triggered at the specimen PR by the primary electron beam PE. The secondary electron current registered in the detectors DT1–DT4 (only detectors DT2 and DT3 being shown for reasons of clarity) and fluctuating in intensity as a consequence of the different materials and/or topography of the specimen PR generates light pulses in the scintillators SZ1–SZ4. The light pulses are supplied through the light guides L1–L4 to the common photomultiplier PM and are converted into a secondary electrical signal in the photomultiplier PM. The secondary electrical signal is amplified further in the signal processing unit SV and may be subjected to a low pass filtering to improve the signal-to-noise ratio. Subsequently, the signal is supplied to an input Z for controlling the intensity of a write beam of the display means CRT. The x and y deflection means of the display means CRT are driven by voltages $U_x$ and $U_y$ from the scan generator RG through corresponding outputs 1 and 2. The x and y deflection voltages $U_x$ and $U_y$, respectively, are also supplied to corresponding inputs of the deflection unit RE. A synchronized deflection of the primary electron beam PE over the specimen surface and of the write beam of the display means CRT over the picture screen is thereby achieved.

To generate an electrical field rotating with a constant rotational frequency $f_R$ and having a rotational speed of $2\pi f_R$ on a chronological average above the specimen PR, a signal generator G supplies sinusoidal voltages having a frequency $f_R$. A phase shifter PS, which is, for example, a resistor-capacitor network, is provided. Sinusoidal voltages U1"–U4" are respectively phase-shifted by 90° relative to one another and are available at the four outputs of the phase shifter PS for connection to individual ones of the extraction electrodes A1–A4 via signal lines SL1–SL4. Symmetrical extraction of the secondary electrons SE over a chronological average is thus guaranteed, so long as the rotational duration of the electrical field is short relative to the dwell time of the primary beam PE on a measuring point.

To correct for deviations of the primary beam PE from its rated, or predetermined, position on the specimen PE the deviations resulting from the chronologically variable extraction field of the detector system, a circuit arrangement is included composed of, for example, a controllable phase shifter PS1, a potentiometer POT, and a pair of adders AD1 and AD2. The deviation correcting circuit arrangement is arranged between the outputs 1 and 2 of the scan generator RG and the corresponding inputs of the deflection unit RE. An additional deflection field is, thus, generated by the deflection unit RE to accelerate the primary electrons PE in a direction opposite the momentary extraction direction of the secondary electrons SE. To provide the additional deflection field, the output of the signal generator G is also connected to plus inputs of the adders AD1 and AD2 through the controllable phase shifter PS1 and the potentiometer POT. A second phase shifter PS2 is connected between the adder AD2 which influences the y deflection voltage $U_y$ and the potentiometer POT. The amplitude of the output from the deflection unit RE is set by the potentiometer POT, its phase relation by the phase shifter PS1. To achieve a correction of said deviations the phase relation of the deflection field of the deflection unit RE is set by the phase shifter PS1 in a way that it acts oppositely with respect to the electrical extraction field of the detector arrangement.

The method of the present invention has so far been described with reference to three-dimensionally symmetrical detector systems. It is of course possible to apply the present invention to a three-dimensionally asymmetrical arrangement. To achieve an extraction of secondary electrons that is symmetrical on a chronological average in such cases, correspondingly higher extraction voltages, for example, are applied to deflection electrodes lying at a greater distance from the beam axis.

In accordance with a further development of the present invention, the voltage amplitudes applied to the extraction or deflection electrodes and the times during which the voltages are applied to the respective electrodes are controlled dependent of the position of the primary electron beam on the specimen. As a result, detection conditions that are uniform across the entire surface of a specimen are achieved for very large area specimens.

The method of the present invention is applicable to a spectrometer as disclosed, for example, in a publication by H. P. Feuerbaum in SEM/1979/1 SEM Inc., ANF O'Hare, IL 60666, pages 285–296, or in U.S. Pat. No. 4,464,571. The disclosed retarding field spectrometers preferably are used for quantitative measurements of voltages in LSI circuits and are generally formed of an extraction electrode, one or more retarding field electrodes, and a deflection unit for accelerating the secondary electrons in the direction of a scintillator. As a consequence of the asymmetrical format of the deflection units, the secondary electrons which proceed on paths in the proximity of the housing parts far from the axis are only slightly deflected and, therefore, do not contribute to the signal measured in the detector. To achieve a symmetrical extraction of the secondary electrons above the retarding potential electrodes, an appropriately modified detector system such as shown in FIGS. 1 or 2 herein, can be used as a deflection element and, for example, can be charged with voltages such as shown in FIG. 4.

Although other modifications and changes may be suggested by those skilled in the art, it is the intention of the inventor to embody within the patent warranted hereon all changes and modifications as reasonably and properly come within the scope of his contribution to the art.

I claim as my invention:

1. A method for detecting secondary particles triggered on a specimen by a primary beam using a detector having at least one region sensitive to the secondary particles and a plurality of electrodes chargeable with voltages for deflecting and accelerating the secondary particles in the direction of the sensitive regions, the method comprising:
    driving said individual electrodes with time dependent voltages of identical frequency;
    phase-shifting said voltages supplied to said electrode arrangements so that a field rotating with a fixed sense is generated having a rotational frequency corresponding to the frequency of the voltages applied to the individual electrode arrangements, said rotating field causing successive deflections of the secondary particles in the direction of the individual sensitive regions; and
    selecting a rotation time for said field at most equal to the dwell time of the primary particle beam on the measuring point of the specimen.

2. A method for detecting secondary particles triggered on a specimen by a primary beam using a detector having at least one region sensitive to the secondary particles and a plurality of electrodes chargeable with time dependent voltages for deflecting and accelerating the secondary particles in the direction of the sensitive regions, the method comprising:
    applying time dependent voltages of identical time duration and amplitude shited in time from one another said individual electrodes so that the secondary particles are extracted spatially symmetrically on a chronological average relative to the dwell time of the primary beam on a point of the specimen.

3. A method for detecting secondary particles triggered on a specimen by a primary beam using a detector having at least one region sensitive to the secondary particles and a plurality of electrodes chargeable with time dependent voltages for deflecting and accelerating the secondary particles in the direction of the sensitive regions, the method comprising:
    generating a time dependent resultant extraction field for the secondary particles;
    extracting the secondary particles weighted in one direction on a chronological average that is relative to the dwell time of the primary beam on a point on the specimen by dimensioning at least one of the durations of the voltages applied to individual ones of said electrode arrangements.

4. A method as claimed in claim 1, wherein said voltages for application to said electrode arrangements are square-waves.

5. An arrangement for detecting secondary particles triggered at a specimen by a primary particle beam, comprising:
    a detector system having at least one region sensitive to secondary particles;
    electrode arrangements at said sensitive region for deflecting and accelerating the secondary particles;
    a signal generator;
    means at an output of said signal generator for selectively driving individual ones of said electrode arrangements; and
    an electronic switch connected to selectively drive ones of said electrode arrangements.

6. An arrangement for detecting secondary particles triggered at a specimen by a primary particle beam, comprising:
    a detector system having at least one region sensitive to secondary particles;
    electrode arrangements at said sensitive region for deflecting and accelerating the secondary particles;
    a signal generator;
    means at an output of said signal generator for selectively driving individual ones of said electrode arrangements; and
    a phase shifter connected to selectively drive ones of said electrode arrangements.

7. An arrangement for detecting secondary particles triggered at a specimen by a primary particle beam, comprising:
    a detector system having at least one region sensitive to secondary particles;
    electrode arrangements at said sensitive region for deflecting and accelerating the secondary particles;
    a signal generator;
    means at an output of said signal generator for selectively driving individual ones of said electrode arrangements; and
    said detector system being formed of a plurality of individual detectors disposed three-dimensionally separated from one another, and
    each of said electrode arrangements has at least one electrode connected to said means for selectively driving.

8. An arrangement as claimed in claim 5, wherein said detector system includes
    an annular light guide having a scintillator layer at an inside surface of said light guide,
    a metal layer disposed at said scintillator layer, and
    a plurality of extraction electrodes concentrically disposed relative to an axis of symmetry of said light guide.

9. A method for detecting secondary particles generated as a result of primary particles impinging a specimen to be investigated, comprising:

generating a time dependent resultant extraction field for the secondary particles;

chronologically changing the direction of said extraction field to change the extraction direction of secondary particles; and periodically repeating said changes in said field direction in a time at most equal to a dwell time of the primary particles on a point of the specimen.

10. A method for detecting secondary particles generated as a result of primary particles impinging a specimen to be investigated, comprising:

generating time dependent resultant extraction field for the secondary particles;

chronologically changing the direction of said extraction field to change the extraction direction of secondary particles;

periodically repeating said changes in said field direction in a time at most equal to a dwell time of the primary particles on a point of the specimen;

wherein an instantaneous field direction is asynometrical with respect to a beam of the primary particles but wherein a chronological average of said field direction is symmetrical with respect to said beam of the primary particles.

11. A method for detecting secondary particles generated as a result of primary particles impinging a specimen to be investigated, comprising:

generating a time dependent resultant extraction field for the secondary particles;

chronologically changing the direction of said extraction field to change an extraction direction of the secondary particles;

periodically repeating said chronological changing of said field direction in a time at most equal to a dwell time of the primary particles on a point of the speciment; and weighting a chronological average of extraction direction in a predetermined direction.

12. A method for detecting secondary particles generated as a result of primary particles impinging a specimen to be investigated, comprising:

generating a time dependent resultant extraction field for the secondary particles;

chronologically changing the direction of said extraction field to change an extraction direction of the secondary particles;

periodically repeating said chronological changing of said field direction in a time at most equal to a dwell time of the primary particles on a point of the specimen; and said periodically repeated chronological changing of said extraction field generating a rotating extraction field.

13. A method as claimed in claim 12, wherein said extraction field rotates with constant speed.

14. A method as claimed in claim 9, further comprising:

applying a chronologically changing deviation correcting field to the primary particles having a substantially opposite effect of said chronologically changing extraction field.

15. A method for detecting secondary particles triggered on a specimen by a primary beam using a detector having at least one region sensitive to the secondary particles and a plurality of electrodes chargeable with time dependent voltages for deflecting and accelerating the secondary particles in the direction of the sensitive regions, the method comprising:

extracting the secondary particles weighted in one direction on a chronological average that is relative to the dwell time of the primary beam on a point on the specimen by dimensioning at least one of the amplitudes of the voltages applied to individual ones of said electrode arrangements.

16. An arrangement as claimed in claim 6, wherein said detector sytem includes an annular light guide having a scintillator layer at an inside surface of said light guide, a metal layer disposed at said scintillation layer, and a plurality of extraction electrode concentrically disposed relative to an axis of symmetry of said light guide.

17. A method as claimed in claim 10, further comprising:

applying a chronologically changing deviation correcting field to the primary particles having a substantially opposite effective of said time dependent resultant extraction field.

18. A method as claimed in claim 11, further comprising:

applying a chronologically changing deviation correcting field to the primary particles having a substantially opposite effect of said time dependent resultant extraction field.

* * * * *